United States Patent
Yang et al.

(10) Patent No.: US 9,771,479 B2
(45) Date of Patent: Sep. 26, 2017

(54) HALOGEN-FREE RESIN COMPOSITION AND USE THEREOF

(71) Applicant: SHENGYI TECHNOLOGY CO., LTD., Dongguan (CN)

(72) Inventors: Hu Yang, Dongguan (CN); Yueshan He, Dongguan (CN)

(73) Assignee: SHENGYI TECHNOLOGY CO., LTD. (CN)

( * ) Notice: Subject to any disclaimer, the term of this patent is extended or adjusted under 35 U.S.C. 154(b) by 44 days.

(21) Appl. No.: 15/027,353

(22) PCT Filed: Mar. 21, 2014

(86) PCT No.: PCT/CN2014/073846
§ 371 (c)(1),
(2) Date: Apr. 5, 2016

(87) PCT Pub. No.: WO2015/120653
PCT Pub. Date: Aug. 20, 2015

(65) Prior Publication Data
US 2016/0244611 A1    Aug. 25, 2016

(30) Foreign Application Priority Data

Feb. 14, 2014 (CN) .......................... 2014 1 0051996

(51) Int. Cl.

| | |
|---|---|
| *B32B 15/04* | (2006.01) |
| *C08L 79/04* | (2006.01) |
| *C08K 3/00* | (2006.01) |
| *C08K 5/49* | (2006.01) |
| *C08L 25/10* | (2006.01) |
| *C08L 71/12* | (2006.01) |
| *C09D 179/04* | (2006.01) |
| *H05K 1/02* | (2006.01) |
| *H05K 1/03* | (2006.01) |
| *H05K 1/09* | (2006.01) |
| *B32B 15/098* | (2006.01) |
| *B32B 15/20* | (2006.01) |
| *C08G 14/06* | (2006.01) |
| *C08G 14/12* | (2006.01) |
| *C09J 161/34* | (2006.01) |
| *B32B 5/02* | (2006.01) |
| *B32B 5/26* | (2006.01) |
| *B32B 7/10* | (2006.01) |
| *B32B 15/14* | (2006.01) |
| *B32B 15/18* | (2006.01) |
| *B32B 15/08* | (2006.01) |

(52) U.S. Cl.
CPC .............. *C08L 79/04* (2013.01); *B32B 5/022* (2013.01); *B32B 5/024* (2013.01); *B32B 5/26* (2013.01); *B32B 7/10* (2013.01); *B32B 15/098* (2013.01); *B32B 15/14* (2013.01); *B32B 15/18* (2013.01); *B32B 15/20* (2013.01); *C08G 14/06* (2013.01); *C08G 14/12* (2013.01); *C08K 3/00* (2013.01); *C08K 5/49* (2013.01); *C08L 25/10* (2013.01); *C08L 71/12* (2013.01); *C09D 179/04* (2013.01); *C09J 161/34* (2013.01); *H05K 1/0298* (2013.01); *H05K 1/0373* (2013.01); *H05K 1/09* (2013.01); *B32B 2260/021* (2013.01); *B32B 2260/023* (2013.01); *B32B 2260/046* (2013.01); *B32B 2262/10* (2013.01); *B32B 2262/101* (2013.01); *B32B 2264/102* (2013.01); *B32B 2307/204* (2013.01); *B32B 2307/306* (2013.01); *B32B 2307/732* (2013.01); *B32B 2457/08* (2013.01); *H05K 2201/012* (2013.01); *H05K 2201/0355* (2013.01)

(58) Field of Classification Search
CPC ....................................................... C08L 79/04
USPC ......................................................... 428/457
See application file for complete search history.

(56) References Cited

U.S. PATENT DOCUMENTS

2008/0171817 A1    7/2008  Peters et al.
2010/0258340 A1   10/2010  Su

FOREIGN PATENT DOCUMENTS

| CN | 1280337  C | 10/2006 |
|---|---|---|
| CN | 101544841 A | 9/2009 |
| CN | 101544841 B | 7/2010 |
| CN | 102093666 A | 6/2011 |
| CN | 102161823 A | 8/2011 |

(Continued)

OTHER PUBLICATIONS

Guangdong Shengyi Sci. Tech Co., Ltd., AN 2013-K43178, XP002764790, & CN102977551A, Thomson Scientific. 2013. Abstract; claims 1-10.

(Continued)

*Primary Examiner* — Terressa Boykin
(74) *Attorney, Agent, or Firm* — McDonald Hopkins LLC

(57) ABSTRACT

The present invention relates to a halogen-free resin composition, a prepreg and a laminate prepared therefrom. The halogen-free resin composition comprises, based on the weight parts of organic solids, (A) from 40 to 80 parts by weight of allyl-modified benzoxazine resin, (B) from 10 to 20 parts by weight of hydrocarbon resin, (C) from 10 to 40 parts by weight of allyl-modified polyphenyl ether resin, (D) from 10 to 20 parts by weight of allyl-modified bismaleimide resin, (E) from 0.01 to 3 parts by weight of an initiator, (F) from 10 to 100 parts by weight of a filler, and (G) from 0 to 80 parts by weight of a phosphorus-containing flame retardant. The prepreg and laminate prepared from the halogen-free resin composition have lower dielectric constant and dielectric loss tangent value, higher peel strength, high glass transition temperature, excellent thermal resistance and better flame retardant effect.

22 Claims, No Drawings

(56) References Cited

FOREIGN PATENT DOCUMENTS

| | | |
|---|---|---|
| CN | 102850726 A | 1/2013 |
| CN | 102850766 A | 1/2013 |
| CN | 102977551 A | 3/2013 |
| CN | 103265791 A | 8/2013 |
| EP | 0352868 A1 | 1/1990 |
| EP | 2241589 A2 | 10/2010 |
| EP | 2657296 A1 | 10/2013 |
| WO | 2013029271 A1 | 3/2013 |
| WO | 2014023095 A1 | 2/2014 |

OTHER PUBLICATIONS

Extended European Search Report for Application 14882285.1-1303, PCT/CN2014/073846 dated Dec. 23, 2016, 10 pgs., European Patent Office, Germany.

ISA/CN, International Search Report and Written Opinion prepared for PCT/CN2014/073846 dated Nov. 19, 2014.

HALOGEN-FREE RESIN COMPOSITION AND USE THEREOF

CROSS REFERENCE TO RELATED APPLICATIONS

This application is a 35 U.S.C. 371 national stage filing and claims priority to International Application No. PCT/CN2014/073846 filed on Mar. 21, 2014, entitled "HALOGEN-FREE RESIN COMPOSITION AND USE FOR SAME" which claims the benefit to Chinese Patent Application No. 201410051996.9 filed on Feb. 14, 2014, each of which is incorporated herein in its entirety by reference.

BRIEF SUMMARY OF THE INVENTION

The present invention relates to the technical field of the preparation of copper-clad laminates and relates to a halogen-free resin composition and use thereof. Specifically, the present invention relates to a halogen-free resin composition, a resin varnish prepared by using such halogen-free resin composition, a prepreg, a laminate and a copper-clad laminate.

BACKGROUND OF THE INVENTION

For conventional copper-clad laminates for printed circuit, brominated epoxy resins are primarily used to achieve flame retardant function of the plates via bromine. In recent years, carcinogens, such as dioxin, dibenzofuran and the like, have been detected in combustion products of waste electrical and electronic equipment containing halogens, such as bromide, fluorine, and the like. Moreover, the halogen-containing products may release extremely toxic substance-halogen hydride during combustion. Two Environmental Directives, Waste Electrical and Electronic Equipment Directive and The Restriction of the Use of Certain Hazardous Substances in Electrical and Electronic Equipment, were formally implemented on Jul. 1, 2006. Since the combustion products of halogen-containing products are not environmental and the above Environmental Directives were implemented, the development of halogen-free flame-retardant copper-clad laminates became a hot topic in the industry, and copper-clad laminate manufacturers have launched their own halogen-free flame-retardant copper-clad laminates in succession.

In recent years, with the development of high performance, high functionality and networking of computers and information communication equipment, operating signals tends to be high frequency for high-speed transmission and processing high-capacity information, so as to raise much demand on the materials of circuit boards. Among current materials used for printed circuit base board, epoxy resin having excellent adhesive properties is widely used. However, epoxy resin circuit base board generally has a higher dielectric constant and dielectric loss tangent (the dielectric constant being higher than 4, and the dielectric loss tangent being about 0.02) and has no sufficient high frequency properties, so that it cannot adapt to the demand on high-frequency signal. Thus it is necessary to develop resins having excellent dielectric properties, i.e., having low dielectric constant and dielectric loss tangent. For a long time, those skilled in the art conducted studies on thermosetting polybutadiene or copolymer resin of polybutadiene and styrene having improved dielectric performance.

WO97/38564 discloses a circuit base board prepared by using non-polar tetramer of styrene, butadiene and divinyl benzene added with a magnesium aluminosilicate filler, and glass fabrics as the reinforcing material. Although it has excellent dielectric performance, the base board has a worse thermal resistance, a glass transition temperature of only 100° C., and a very high thermal expansion coefficient, so that it cannot satisfy the requirement on higher temperature (higher than 240° C.) of lead-free process during the manufacture of PCB.

U.S. Pat. No. 5,571,609 discloses a circuit base board prepared by using 1,2-polybutadiene resin or polyisobutadiene having a molecular weight of less than 5000 together with copolymers of butadiene and styrene having high molecular weight, adding a large amount of silica powder as the filler, using glass fabrics as the reinforcing material. Although it has excellent dielectric performance, the addition of ingredients having high molecular weights for improving the adhesive situation of prepregs worsens the processing performance of the process for manufacturing prepregs. Moreover, the manufactured plates have worse rigidity and a very low flexural strength since there is a small proportion of the rigid structural benzene ring in the resin molecules of the whole resin system, and most of the chain segments after crosslinking are composed of methylene having a very low rigidity.

U.S. Pat. No. 6,569,943 discloses using an amine-modified liquid polybutadiene resin having ethylene at the end of molecules, adding a large amount of styrene dibromide monomers having low molecular weight as the curing agent and diluent, dipping glass fabrics to produce a circuit base board. Although the circuit base board has good dielectric performance, the general stacking process of prepregs cannot be used during the pressing molding process since the resin system is in a liquid state at room temperature and cannot be made into non-adhesive prepregs. The technological operation is very difficult.

CN1280337C discloses using a polypolyphenyl ether resin having unsaturated double bonds at the end of the molecules, and using ethylene monomers (e.g., styrene dibromide) as the curing agent. However, these monomers, having low molecular weight, have a low boiling point and will be volatized during the oven-drying process of producing prepregs by dipping glass fabrics, so that the sufficient amount of the curing agent cannot be ensured. In addition, although the reference mentions that polybutadiene resin may be used to modify the viscosity of the system, it does not clearly disclose using polybutadiene resin having polar groups to improve the peel strength.

CN101544841B discloses using a hydrocarbon resin having a molecular weight of less than 11000 and an ethylene content of higher than 60% as the main body, using allyl-modified phenolic resin to improve the tacky properties of prepregs. The peel strength thereof has increased to some extent, but the system has a low thermal resistance after curing. Moreover, the copper-clad laminates have a higher risk of delamination failure during the manufacturing process of PCB.

The system using the hydrocarbon resin as main body has a lower bonding force with metals and has a lower thermal resistance, and will bring a greater chance of loss efficacy risk during the PCB processing process at the downstream of copper-clad plates.

DETAILED DESCRIPTION OF THE INVENTION

As for the problems in the prior art, one objective of the present invention is to provide a halogen-free resin composition. The prepreg and laminate prepared from the halogen-free resin composition have a lower dielectric constant and dielectric loss tangent value, higher peel strength, higher glass transition temperature, excellent thermal resistance, and better flame retardant effects.

In order to achieve such objective, the following technical solution is used in the present invention.

A halogen-free resin composition, based on the weight parts of organic solids, comprising:

(A) from 40 to 80 parts by weight of allyl-modified benzoxazine resin, (B) from 10 to 20 parts by weight of hydrocarbon resin, (C) from 10 to 40 parts by weight of allyl-modified polyphenyl ether resin, (D) from 10 to 20 parts by weight of allyl-modified bismaleimide resin, and (E) from 0.01 to 3 parts by weight of an initiator.

The component (A) allyl-modified benzoxazine resin is in an amount of, e.g., 42, 44, 46, 48, 50, 52, 54, 56, 58, 60, 62, 64, 66, 68, 70, 72, 74, 76, or 78 parts by weight.

The component (B) hydrocarbon resin is in an amount of, e.g., 11, 12, 13, 14, 15, 16, 17, 18, or 19 parts by weight.

The component (C) allyl-modified polyphenyl ether resin is in an amount of, e.g., 12, 14, 16, 18, 20, 22, 26, 28, 30, 32, 34, 36, or 38 parts by weight.

The component (D) allyl-modified bismaleimide resin is in an amount of, e.g., 11, 12, 13, 14, 15, 16, 17, 18, or 19 parts by weight.

The component (E) initiator is in an amount of, e.g., 0.03, 0.05, 0.08, 0.1, 0.4, 0.7, 1, 1.3, 1.5, 1.7, 1.9, 2.1, 2.3, 2.5, 2.7, or 2.9 parts by weight.

The present invention uses an allyl-modified benzoxazine resin as the main body to provide the system with excellent thermal resistance and better electrical performance, and further improves the electrical performance of the curing system together with allyl-modified polyphenyl ether resin and hydrocarbon resin having excellent electrical performance. In order to further increase the glass transition temperature of the curing system, the present invention also adds allyl-modified bismaleimide resin into the system to further increase the thermal resistance and glass transition temperature of the curing system. Each component of such resin composition comprises carbon-carbon double bonds. During the curing reaction, the initiator will release active free radicals under thermal action. Under the action of free radicals, the double bonds of each component resin will produce cross-linked macromolecular polymers according to the mechanism of free radical polymerization. During the whole polymerization, no polar radical like hydroxyl group is produced, and the polymerization products keep excellent dielectric property and dielectric loss value of the raw materials to a maximum extent.

Preferably, the component (A) allyl-modified benzoxazine resin is, based on the technical solution of the present invention, one or a mixture of at least two or more materials selected from allyl-modified bisphenol-A benzoxazine resin, allyl-modified bisphenol-F benzoxazine resin, allyl-modified dicyclopentadiene phenol benzoxazine resin, allyl-modified bisphenol-S benzoxazine resin, and diamine benzoxazine resin. The mixture is, for example, a mixture of allyl-modified bisphenol-A benzoxazine resin and allyl-modified bisphenol-F benzoxazine resin, a mixture of allyl-modified dicyclopentadiene phenol benzoxazine resin and allyl-modified bisphenol-S benzoxazine resin, a mixture of diamine benzoxazine resin, allyl-modified bisphenol-A benzoxazine resin and allyl-modified bisphenol-F benzoxazine resin, or a mixture of allyl-modified dicyclopentadiene phenol benzoxazine resin, allyl-modified bisphenol-S benzoxazine resin, and diamine benzoxazine resin.

Preferably, the hydrocarbon resin is, based on the technical solution of the present invention, a hydrocarbon resin having an average molecular weight of less than 11000, composing of carbon and hydrogen and having an ethylene content of higher than 60% and being in a liquid state at room temperature, preferably a hydrocarbon resin having a average molecular weight of less than 7000, having an ethylene content added at positions 1, 2 of higher than 70% and being in a liquid state at room temperature.

Preferably, the allyl-modified polyphenyl ether resin is, based on the technical solution of the present invention, an allyl-modified polyphenyl ether resin having a average molecular weight of less than 5000, which ensures the free radical polymerization with other resins to finally produce a homogeneous modified resin system, to reduce the chance of the phase separation of the system, and to avoid any negative effects on the electrical property of the system.

Preferably, the initiator is, based on the technical solution of the present invention, an material which can release free radicals under thermal action, and is selected from organic peroxides, preferably one or a mixture of at least two selected from dicumyl peroxide, tert-butyl peroxybenzoate and 2,5-di(2-ethyl hexanoyl peroxy)-2,5-dimethylhexane. The mixture is, for example, a mixture of dicumyl peroxide and tert-butyl peroxybenzoate, a mixture of 2,5-di(2-ethyl hexanoyl peroxy)-2,5-dimethylhexane and dicumyl peroxide, a mixture of tert-butyl peroxybenzoate and 2,5-di(2-ethyl hexanoyl peroxy)-2,5-dimethylhexane and dicumyl peroxide, a mixture of dicumyl peroxide, tert-butyl peroxybenzoate and 2,5-di(2-ethyl hexanoyl peroxy)-2,5-dimethylhexane.

Preferably, the halogen-free resin composition further comprises: (F) a filler on the basis of the technical solution provided in the present invention.

Preferably, the filler is in an amount of, based on the technical solution of the present invention, from 1 to 100 parts by weight, e.g., 5, 10, 15, 20, 25, 30, 35, 40, 45, 50, 55, 60, 65, 70, 75, 80, 85, 90, or 95 parts by weight, and preferably from 10 to 100 parts by weight.

Preferably, the filler is, based on the technical solution of the present invention, is one or a mixture of at least two selected from silica, titanium dioxide, strontium titanate, barium titanate, boron nitride, aluminum nitride, silicon carbide and alumina, preferably one or a mixture of at least two selected from crystalline silica, amorphous silica, spherical silica, titanium dioxide, strontium titanate, barium titanate, boron nitride, aluminum nitride, silicon carbide and alumina. The mixture is, for example, a mixture of crystalline silica and amorphous silica, a mixture of spherical silica and titanium dioxide, a mixture of strontium titanate and barium titanate, a mixture of boron nitride and aluminum nitride, a mixture of silicon carbide and alumina, a mixture of crystalline silica, amorphous silica and spherical silica, a mixture of titanium dioxide, strontium titanate and barium titanate, a mixture of boron nitride, aluminum nitride, silicon carbide and alumina.

Preferably, the filler is, based on the technical solution of the present invention, silica.

Preferably, the moderate value of the particle size of the filler is, based on the technical solution of the present invention, from 1 µm to 15 µm, e.g., 2 µm, 3 µm, 4 µm, 5 µm, 6 µm, 7 µm, 8 µm, 9 µm, 10 µm, 11 µm, 12 µm, 13 µm or 14 µm, preferably from 1 µm to 10 µm, further preferably from 1 µm to 5 µm. The filler within the range of such particle size has a better dispersibility in the resin varnish.

Preferably, the halogen-free resin composition further comprises (G) a phosphorus-containing flame retardant.

Preferably, the phosphorus-containing flame retardant is in an amount of, based on the technical solution of the present invention, from 0 to 80 parts by weight, excluding 0, e.g., 0.05, 1, 3, 5, 10, 15, 20, 25, 30, 35, 40, 45, 50, 55, 60, 65, 70, 72, 74, 76, or 78 parts by weight.

Preferably, the phosphorus-containing flame retardant is, based on the technical solution of the present invention, one or a mixture of at least two selected from tri-(2,6-dimethylphenyl)-phosphine, 10-(2,5-dihydroxylphenyl)-9,10-dihydro-9-oxa-10-phosphaphenanthrene-10-oxide, 2,6-di-(2, 6-dimethylphenyl)phosphine benzene, 10-phenyl-9,10-dihydro-9-oxa-10-phosphaphenanthrene-10-oxide, polyphenoxyphosphazene and derivatives thereof.

Preferably, the halogen content of the halogen-free resin composition is in an amount of, based on the technical solution of the present invention, less than 0.09 wt. %, e.g., 0.01 wt. %, 0.02 wt. %, 0.03 wt. %, 0.04 wt. %, 0.05 wt. %, 0.06 wt. %, 0.07 wt. %, or 0.08 wt. %.

An exemplary halogen-free resin composition comprises, based on the weight parts of organic solids:
(A) from 40 to 80 parts by weight of allyl-modified benzoxazine resin, (B) from 10 to 20 parts by weight of hydrocarbon resin,
(C) from 10 to 40 parts by weight of allyl-modified polyphenyl ether resin,
(D) from 10 to 20 parts by weight of allyl-modified bismaleimide resin,
(E) from 0.01 to 3 parts by weight of an initiator,
(F) from 1 to 100 parts by weight of a filler, and
(G) from 0 to 80 parts by weight of a phosphorus-containing flame retardant.

The words, "comprise" and/or "comprising" in the present invention means that, besides said components, there may be other components which endow the halogen-free resin composition with different properties. In addition, the words "comprise" and/or "comprising" in the present invention may be replaced with "is/are" or "consist of" in a closed manner.

For example, the halogen-free resin composition may comprise various additives. As specific examples, antioxidants, thermal stabilizers, antistatic agents, ultraviolet light absorbers, pigments, colorants or lubricants may be used. These additives may be used separately or in a mixture.

The second objective of the present invention is to provide a resin varnish obtained by dissolving or dispersing the aforesaid halogen-free resin composition in a solvent.

The solvents in the present invention are not specifically limited. As specific examples, any one or a mixture of at least two or more may be selected from acetone, butanone, cyclohexanone, ethylene glycol methyl ether, propylene glycol methyl ether, propylene glycol methyl ether acetate, benzene, toluene and xylene can be used. The amount thereof is determined according to the demand, and it is better to make the resin varnish reach suitable viscosity.

The exemplary method for preparing the halogen-free resin composition varnish comprises: first adding the solids in the aforesaid components into a suitable container, then adding a solvent, stirring until completely dissolution, then adding a suitable filler, and finally adding the liquid resin and initiator, continuing to stir evenly. When used, a solvent may be used to adjust the solid content of the solution to 65-75%, so as to form a varnish.

The third objective of the present invention is to provide a prepreg comprising a reinforcing material and the halogen-free resin composition attached on the reinforcing material after impregnation and drying. The prepreg has a lower dielectric constant and dielectric loss tangent value, higher peel strength, higher glass transition temperature, better thermal resistance, and better flame retardant effect.

The reinforcing material is a reinforcing material disclosed in the prior art, for example, nonwoven fabrics or woven fabrics. The examples include natural fibers, organic synthetic fibers and inorganic fibers, and preferably electronic grade glass fabrics.

The aforesaid resin varnish is used to impregnate the reinforcing materials-fabrics, e.g., glass fabrics, or organic fabrics. The impregnated reinforcing materials are oven-dried in an oven at 170° C. for 5-8 min to produce a prepreg for printed circuit.

The fourth objective of the present invention is to provide a laminate comprising at least one prepreg above.

The fifth objective of the present invention is to provide a copper-clad laminate comprising at least one superimposed prepreg above and copper foils coated on one or two sides of the superimposed prepreg. The copper-clad laminate has a lower dielectric constant and dielectric loss tangent value, higher peel strength, higher glass transition temperature, better thermal resistance and better flame retardant effect.

An exemplary method for preparing the copper-clad laminate comprises superimposing 4 prepregs above with 2 sheets of copper foils having a weight of 1 ounce (having a thickness of 35 μm), laminating in a hot-press to obtain double-sided copper-clad laminate. The lamination of said copper-clad laminate shall satisfy the following requirements: 1. the temperature increasing rate of the lamination is generally controlled within the range of 1.0° C.~3.0° C./min at a material temperature of from 80° C. to 220° C.; 2. the pressure setup: the full pressure of about 300 psi is applied when the material temperature in the outer layer is from 80° C. to 100° C.; 3. the material temperature is controlled at 220° C. during curing and is kept for 120 min; the covering metal foil, besides copper foil, may also be nickel foil, aluminum foil and SUS foil, and the materials thereof are not limited.

As compared with the prior art, the present invention has the following beneficial effects.

The present invention uses an allyl-modified benzoxazine resin as the main body to provide the system with excellent thermal resistance and better electrical performance, and further improves the electrical performance of the curing system together with allyl-modified polyphenyl ether resin and hydrocarbon resin having excellent electrical performance. In order to further increase the glass transition temperature of the curing system, the present invention also adds allyl-modified bismaleimide resin into the system to further increase the thermal resistance and glass transition temperature of the curing system. Each component of such resin composition comprises carbon-carbon double bonds. During the curing reaction, the initiator will release active free radicals under thermal action. Under the action of free radicals, the double bonds of each component resin will produce cross-linked macromolecular polymers according to the mechanism of free radical polymerization. During the whole polymerization, no polar radical like hydroxyl group is produced, and the polymerization products keep excellent dielectric property and dielectric loss value of the raw materials to a maximum extent. The bonding sheet prepared from the halogen-free high frequency resin composition has lower dielectric constant and dielectric loss tangent value, higher peel strength, higher glass transition temperature, better thermal resistance and better flame retardant effect.

The copper-clad laminate prepared from the bonding sheet has lower dielectric constant and dielectric loss tangent value, higher peel strength, higher glass transition temperature, better thermal resistance and better flame retardant effect.

EXAMPLES

The technical solution of the present invention is further disclosed by the following embodiments.

The composition formulae in the examples are shown in Table 1. The physical properties of copper-clad laminates used in printed circuit boards prepared by the aforesaid method, such as dielectric constant, dielectric loss factor and flame retardancy, are shown in Tables 2 and 3.

The halogen-free high-frequency resin composition has the following specific components:
(A) Allyl-modified benzoxazine resin;
A-1 allyl-modified bisphenol-A benzoxazine resin (self-made);
A-1 allyl-modified dicyclopentadiene phenol benzoxazine resin (self-made);
A-3 allyl-modified bisphenol-F benzoxazine resin (self-made);
(B) hydrocarbon resin;
B-1 butylbenzene resin (product mode: Ricon 104H, Sartomer);
B-2 butylbenzene resin (product mode: Ricon 153H, Sartomer);
(C) Allyl-modified polyphenyl ether resin (product mode: PP501, Jinyi, Taiwan);
(D) Allyl-modified bismaleimide resin (self-made);
(E) Initiator: dicumyl peroxide (Gaoqiao, Shanghai);
(F) Filler: spherical silica powder (trade name: SFP-30M, from DENKI KAGAKU KOGYO KABUSHIKI KAISHIA); and
(G) Flame retardant: phenoxyphosphazene compound, SPB-100 (trade name from Otsuka Chemical Co., Ltd).

TABLE 1

Formula Compositions of Each Example and Comparison Example

| | Examples | | | | | | Comparison Examples | | | | | |
|---|---|---|---|---|---|---|---|---|---|---|---|---|
| | 1 | 2 | 3 | 4 | 5 | 6 | 1 | 2 | 3 | 4 | 5 | 6 |
| A-1 | 40 | | 50 | | | 40 | — | 40 | | | | 10 |
| A-2 | | 70 | | 60 | | | — | — | | 70 | 70 | |
| A-3 | | | | | 50 | | — | — | | | | |
| B-1 | 15 | | | 10 | | 15 | 70 | 20 | | | | 5 |
| B-2 | | 10 | 10 | | 10 | | — | — | 10 | 10 | 10 | |
| C | 25 | 10 | 30 | 15 | 20 | 25 | 30 | 40 | 10 | | 10 | 5 |
| D | 20 | 10 | 10 | 15 | 20 | 20 | | — | 10 | 10 | | 80 |
| E | 0.05 | 1 | 3 | 0.7 | 2.5 | 0.05 | 3 | 2.5 | 1 | 1 | 1 | 2 |
| F | 10 | 60 | 30 | 40 | 20 | 100 | 40 | 0 | 60 | 60 | 60 | 60 |
| G | 10 | 5 | 5 | 5 | 10 | 80 | 10 | 10 | 5 | 5 | 5 | 30 |
| Ethylene-modified benzoxazine resin | | | | | | | | | 70 | | | |
| Ethylene-modified polyphenyl ether resin | | | | | | | | | | 10 | | |
| Bismaleimide resin | | | | | | | | | | | 10 | |

Notes:
1. All data in the table are based on the weight parts of solid components.

TABLE 2

Physical Property Data of Each Example and Comparison Example

| | Examples | | | | | |
|---|---|---|---|---|---|---|
| | 1 | 2 | 3 | 4 | 5 | 6 |
| Glass transition temperature Tg (DSC, ° C.) | 205 | 185 | 180 | 190 | 195 | 175 |
| Peel strength PS (N/mm) | 1.3 | 1.4 | 1.33 | 1.25 | 1.35 | 1.2 |
| Flammability (UL94) | V-0 | V-0 | V-0 | V-0 | V-0 | V-0 |
| Thermal delamination time T-288 (min) | >45 | >60 | >45 | >60 | >45 | >30 |
| Thermal expansion coefficient Z-axial CTE (TMA) (30-260° C.) % | 2.4 | 2.1 | 2.2 | 2.0 | 2.2 | 2.8 |

TABLE 2-continued

Physical Property Data of Each Example and Comparison Example

| | Examples | | | | | |
|---|---|---|---|---|---|---|
| | 1 | 2 | 3 | 4 | 5 | 6 |
| Thermal decomposition temperature Td (TGA, °C.) | 390 | 400 | 380 | 410 | 380 | 370 |
| water absorption (%) | 0.10 | 0.08 | 0.10 | 0.08 | 0.10 | 0.10 |
| Dielectric loss angle tangent Df (1 GHZ) | 0.0038 | 0.0033 | 0.0036 | 0.0030 | 0.0042 | 0.0040 |
| Dielectric constant Dk (1 GHZ) | 3.71 | 3.78 | 3.83 | 3.81 | 3.71 | 3.75 |
| Halogen content testing (%) Cl | 0.04 | 0.05 | 0.04 | 0.05 | 0.004 | 0.04 |
| Halogen content testing (%) Br | 0 | 0 | 0 | 0 | 0 | |

TABLE 3

| | Comparison Examples | | | | | |
|---|---|---|---|---|---|---|
| | 1 | 2 | 3 | 4 | 5 | 6 |
| Glass transition temperature Tg (DSC, °C.) | 185 | 170 | 185 | 185 | 190 | 225 |
| Peel strength PS (N/mm) | 0.9 | 1.2 | 1.3 | 0.9 | 1.4 | 1.1 |
| Flammability (UL94) | V-1 | V-0 | V-0 | V-0 | V-0 | V-0 |
| Thermal delamination time T-288 (min) | >5 | >45 | >45 | >45 | >45 | >60 |
| Thermal expansion coefficient Z-axial CTE (TMA) (30-260° C.) % | 2.5 | 2.4 | 2.2 | 2.6 | 2.5 | 2.8 |
| Thermal decomposition temperature Td (TGA, °C.) | 385 | 375 | 405 | 395 | 410 | 395 |
| Water absorption (%) | 0.12 | 0.10 | 0.10 | 0.08 | 0.08 | 0.12 |
| Dielectric loss angle tangent Df (1 GHZ) | 0.0032 | 0.0032 | 0.0063 | 0.0048 | 0.0052 | 0.0065 |
| Dielectric constant Dk (1 GHZ) | 3.66 | 3.68 | 3.98 | 3.76 | 3.92 | 4.02 |
| Halogen content testing (%) Cl | 0.04 | 0.04 | 0.05 | 0.05 | 0.05 | 0.05 |
| Halogen content testing (%) Br | 0 | 0 | 0 | 0 | 0 | 0 |

According to the physical property data in Tables 2 and 3, it can be seen that the copper-clad laminates prepared according to Examples 1-5 have excellent dielectric performance and higher glass transition temperature. As compared with the comparison examples, along with the addition of allyl bismaleimide resin, Tg has been notably increased under the circumstance of ensuring that the electrical property of the system has no significant change.

By comparing Example 2 with Comparison Example 3, it can be seen that the difference lies mainly in that ethylene-modified benzoxazine resin is used in the comparison example to replace allyl-modified benzoxazine resin in the example. Since there is a methylene between the double bonds of allyl and the benzene ring adjacent thereto, the conjugation effect therebetween is greatly reduced, and the double bonds are easy to conduct the free radical polymerization to produce high polymers. However, the double bond on ethylene of ethylene-modified benzoxazine resin will have a very strong conjugation effect with the adjacent benzene ring, so as to greatly increase the difficulty of free radical polymerization for the double bonds on ethylene. Therefore, quite a part of ethylene double bond in ethylene-modified benzoxazine resin in Comparison Example 3 cannot be free-radical polymerized. For such ethylene-modified benzoxazine resin, oxazine ring will open under thermal action to self-polymerize to form high polymers, which will be positive to the increase of the dielectric loss and dielectric constant of the polymerization product.

By comparing Example 2 with Comparison Example 4, it can be seen that the ethylene-modified polyphenyl ether resin is used in the comparison example to replace allyl-modified polyphenyl ether resin in the example. Strong conjugation effect between ethylene and the adjacent benzene ring greatly increases the difficulty of polymerizing according to the free radical polymerization mode for the double bonds on ethylene, so that a part of ethylene polyphenyl ether resin will have to exist in the cured products in a free state, which has no significant effect on the electrical property of the system, but will greatly reduce the bonding performance of the cured products. Meanwhile, polyphenyl ether resin is thermoplastic and is in the cured product in a state of the free-state mixture, which will have a certain negative effect on the thermal expansion coefficient of the cured product.

By comparing Example 2 with Comparison Example 5, it can be seen that common bismaleimide resin is used in the comparison example. Since there are no double bonds in the molecule, the reaction by the way of free radical polymerization cannot be conducted. Thus such resin can react only with oxazine ring in allyl-modified benzoxazine molecule. The reaction product has a very high dielectric loss and dielectric constant, which will have a significant negative effect on decreasing the dielectric constant and dielectric loss of the cured product.

In Comparison Example 6, a large amount of allyl-modified bismaleimide resin is used, which can greatly increase the Tg of the cured product. However, bismaleimide resin per se does not have a very low dielectric loss and dielectric constant, and there is a low proportion of allyl-modified polyphenyl ether resin and hydrocarbon resin in the system which can decrease the dielectric constant and dielectric loss of the cured product. Therefore, the cured product has a higher dielectric loss and dielectric constant although the product has a higher Tg and thermal resistance.

Within the scope of JPCA halogen-free standard requirements, the present invention can achieve the V-0 standard in the flammability test UL94, a low thermal expansion coefficient, a high thermal decomposition stability and a low water absorption. Moreover, the halogen content is less than 0.09%, which satisfies the environmental protection requirements.

In conclusion, the halogen-free high frequency resin composition uses a special benzoxazine resin, polyphenyl ether resin, hydrocarbon resin, bismaleimide resin, curing agent and other components to make it have better synergistic properties and a halogen content less than 0.09%, besides using phosphorus for flame retardancy, so as to achieve the environmental protection standard. Moreover, the bonding sheet prepared by using such halogen-free high frequency resin composition has excellent electrical property, higher glass transition temperature, better thermal resistance, better flame retardant effect and lower water absorption.

The aforesaid properties are tested by the following methods.

Glass transition temperature (Tg): measured by differential scanning calorimetry (DSC) according to DSC method specified in IPC-TM-650 2.4.25.

Peel strength (PS): measured the peel strength of the metal cover coat according to the test conditions of "after thermal stress" in IPC-TM-650 2.4.8.

Flammability: measured according to UL 94 vertical burning method.

Thermal delamination time T-288: measured according to the method specified in IPC-TM-650 2.4.24.1.

Thermal expansion coefficient Z-axial CTE (TMA): measured according to the method specified in IPC-TM-650 2.4.24.

Thermal decomposition temperature Td: measured according to the method specified in IPC-TM-650 2.4.26.

Water absorption: measured according to the method specified in IPC-TM-650 2.6.2.1.

Dielectric loss angle tangent and dielectric constant: measured under 10 GHz according to IPC-TM-650 2.5.5.9, based on the resonance method by using the strips.

Halogen content testing: measured according to the method specified in IPC-TM-650 2.3.41.

The applicant declares that, the present invention discloses the detailed method of the present invention by the aforesaid examples, but the present invention is not limited to the above detailed method, i.e., it does not mean that the present invention cannot be fulfilled unless the aforesaid detailed method is used. Those skilled in the art shall know that, any amendment, equivalent change to the product materials of the present invention, addition of auxiliary ingredients, and selection of any specific modes all fall within the protection scope and disclosure scope of the present invention.

The invention claimed is:

1. A halogen-free resin composition based on the weight parts of organic solids, comprising:
   (A) from about 40 to about 80 parts by weight of allyl-modified benzoxazine resin,
   (B) from about 10 to about 20 parts by weight of hydrocarbon resin,
   (C) from about 10 to about 40 parts by weight of allyl-modified polyphenyl ether resin,
   (D) from about 10 to about 20 parts by weight of allyl-modified bismaleimide resin, and
   (E) from about 0.01 to about 3 parts by weight of an initiator.

2. The halogen-free resin composition according to claim 1, wherein the allyl-modified benzoxazine resin is one or a mixture of at least two selected from allyl-modified bisphenol-A benzoxazine resin, allyl-modified bisphenol-F benzoxazine resin, allyl-modified dicyclopentadiene phenol benzoxazine resin, allyl-modified bisphenol-S benzoxazine resin, and diamine benzoxazine resin.

3. The halogen-free resin composition according to claim 1, wherein the allyl-modified polyphenyl ether resin has an average molecular weight of less than about 5000.

4. The halogen-free resin composition according to claim 1, wherein the halogen-free resin composition further comprises (F) a filler.

5. The halogen-free resin composition according to claim 1, wherein the halogen-free resin composition further comprises (G) a phosphorus-containing flame retardant.

6. The halogen-free resin composition according to claim 1, wherein the halogen-free resin composition has a halogen content of less than about 0.09 wt. %.

7. A resin varnish, wherein the resin varnish is obtained by dissolving or dispersing the halogen-free resin composition according to claim 1 in a solvent.

8. A prepreg comprising a reinforcing material and a halogen-free resin composition according to claim 1 attached thereon after impregnation and drying.

9. A laminate comprising at least one prepreg according to claim 8.

10. A copper-clad laminate, comprising at least one superimposed prepreg according to claim 8 and copper foils coated on one or two sides of the superimposed prepreg.

11. The halogen-free resin composition according to claim 1, wherein the hydrocarbon resin is composed of carbon and hydrogen, has an average molecular weight of less than about 11000, an ethylene content of higher than about 60% and is a liquid at room temperature.

12. The halogen-free resin composition according to claim 1, wherein the hydrocarbon has a number average molecular weight of less than about 7000, an ethylene content added at positions 1, 2 of higher than about 70%, and is a liquid at room temperature.

13. The halogen-free resin composition according to claim 1, wherein the initiator is selected from the group consisting of one or more organic peroxides.

14. The halogen-free resin composition according to claim 1, wherein the initiator is one or a mixture of at least two selected from dicumyl peroxide, tert-butyl peroxybenzoate and 2,5-di(2-ethyl hexanoyl peroxy)-2,5-dimethylhexane.

15. The halogen-free resin composition according to claim 4, wherein the filler is in an amount of from about 1 to about 100 parts by weight.

16. The halogen-free resin composition according to claim 15, characterized in that the filler is in an amount of from about 10 to about 100 parts by weight.

17. The halogen-free resin composition according to claim 8, wherein the filler is one or a mixture of at least two selected from silica, titanium dioxide, strontium titanate, barium titanate, boron nitride, aluminum nitride, silicon carbide and alumina.

18. The halogen-free resin composition according to claim 17, wherein the filler is one, or a mixture of at least two, selected from crystalline silica, amorphous silica, spherical silica, titanium dioxide, strontium titanate, barium titanate, boron nitride, aluminum nitride, silicon carbide and alumina.

19. The halogen-free resin composition according to claim 4, wherein the filler is silica.

20. The halogen-free resin composition according to claim 4, wherein the moderate value of the particle size of the filler is from about 1 μm to about 15 μm.

21. The halogen-free resin composition according to claim 5, wherein the phosphorus-containing flame retardant is in an amount of from about 0 to about 80 parts by weight, excluding 0 parts by weight.

22. The halogen-free resin composition according to claim 5, wherein the phosphorus-containing flame retardant is one or a mixture of at least two selected from tri-(2,6-dimethylphenyl)-phosphine, 10-(2,5-dihydroxylphenyl)-9,10-dihydro-9-oxa-10-phosphaphenanthrene-10-oxide, 2,6-di-(2,6-dimethylphenyl)phosphine benzene, 10-phenyl-9,10-dihydro-9-oxa-10-phosphaphenanthrene-10-oxide, polyphenoxyphosphazene and derivatives thereof.

* * * * *